United States Patent [19]

Foreman et al.

[11] Patent Number: 4,929,306
[45] Date of Patent: May 29, 1990

[54] FIXTURE FOR MOUNTING SMALL PARTS FOR PROCESSING

[76] Inventors: Larry R. Foreman, 2456 36th St., Los Alamos, N. Mex. 87544; Veronica M. Gomez, Rte. 5 Box 283, Santa Fe, N. Mex. 87501; Michael H. Thomas, Rte. 3-193-1, Espanola, N. Mex. 87532

[21] Appl. No.: 250,672

[22] Filed: Sep. 29, 1988

[51] Int. Cl.⁵ .............................................. B32B 31/00
[52] U.S. Cl. ............................ 156/306.3; 156/306.9; 156/329; 428/343; 428/355
[58] Field of Search ............... 428/343, 355; 118/500, 118/503; 51/216 R, 229; 269/53; 156/247, 306.3, 329, 306.9, 344

[56] References Cited

U.S. PATENT DOCUMENTS 3,297,186 1/1967 Wells .................................. 428/34.4
3,393,819 7/1968 Van de Walle ..................... 428/34.4
3,952,133 4/1976 Amos .................................. 428/343
4,301,205 11/1981 Seltenheim ......................... 428/343
4,415,619 11/1983 Fuglein .............................. 428/343

OTHER PUBLICATIONS

"A Method for Making Shaped Layers on Spherical Substrates"; Los Alamos National Laboratory; LA-UP-87-940; Aug. 1987.

Primary Examiner—George F. Lesmes
Assistant Examiner—J. Davis

[57] ABSTRACT

A fixture for mounting small parts, such as fusion target spheres or microelectronic components. A glass stalk is drawn and truncated near its tip. The truncated end of the glass stalk is dipped into silicone rubber forming an extending streamer. After the rubber cures for approximately 24 hours, a small part is touched to the streamer, and will be held securely throughout processing.

8 Claims, 1 Drawing Sheet

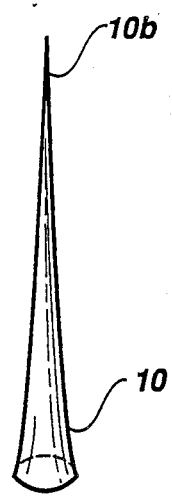
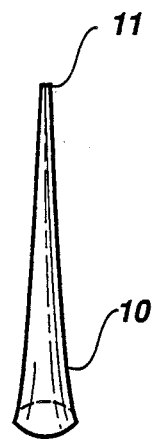
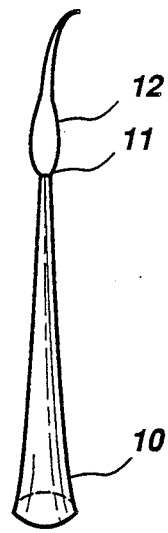
Fig. 1  Fig. 2  Fig. 3
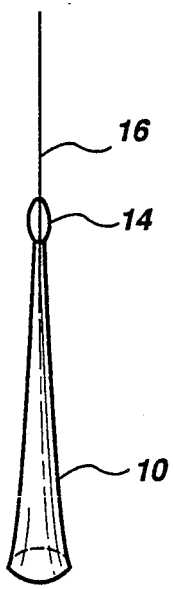
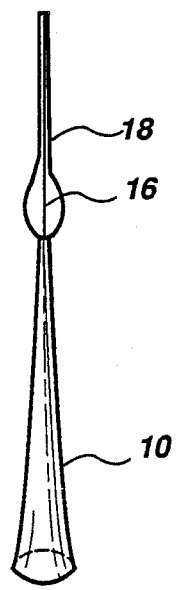
Fig. 4  Fig. 5

FIXTURE FOR MOUNTING SMALL PARTS FOR PROCESSING

The invention is a result of a contract with the Department of Energy (Contract No. W-7405-ENG-36).

BACKGROUND OF THE INVENTION

This invention relates to the field of parts processing and, more specifically, to the mounting of very small parts during processing of a contract with the Department of Energy (Contract No. W-7405-ENG-36).

The processing of very small parts is becoming increasingly important, particularly in the fields of nuclear fusion research and microelectronics. In nuclear fusion research, submillimeter diameter glass spheres are frequently used as targets. Often, these spheres need to be coated either partially or totally with a material. This normally requires that the sphere be held during a coating step and also during the step when some of the coating is machined off the sphere. Similar requirements are seen in the microelectronic industry.

In the past, the normal methods of mounting such parts for processing have involved vacuum fixtures, or the physical holding of the part in some other type of fixture. As a vacuum fixture utilizes a local vacuum to hold a part, it is useless in a vacuum processing environment. However, physically holding an object in a fixture often damages the part being held. Both techniques prevent a substantial portion of the part from being coated because of the surface area covered by the mounting.

It is an object of the present invention to provide apparatus by which small parts can be securely mounted during processing.

It is a further object to provide apparatus for mounting small parts during processing which does not damage the part and which does not cover a substantial portion of the surface of the part.

SUMMARY OF THE INVENTION

To achieve the foregoing and other objects, and in accordance with the purposes of the present invention, as embodied and broadly described herein, apparatus for mounting small parts for processing may comprise a truncated conical glass stalk having a tip end and a base end and a quantity of a cured adhesive attached to the tip end, the cured adhesive forming an extended streamer to adhere small parts to the stalk.

In a further aspect of the present invention, and in accordance with its objects and purposes, a method of mounting small parts for processing may comprise forming a truncated conical glass stalk having a tip end and a base end. A quantity of cured adhesive is formed on the tip end, the adhesive having an extending streamer. Small parts are then touched to the streamer to adhere the parts to the stalk.

BRIEF DESCRIPTION OF THE DRAWINGS

FIG. 1 is a view of a glass stalk after it has been drawn and separated from the remaining capillary tube.

FIG. 2 is a view of a glass stalk according to the present invention after its tip has been removed.

FIG. 3 is a view of a glass stalk according to the present invention after its tip has been dipped into RTV silicone rubber forming a streamer for the direct mounting of small parts.

FIG. 4 is a view of a glass stalk with a carbon fiber fixed in place with epoxy.

FIG. 5 is a view of a glass stalk with its carbon fiber coated with RTV silicone rubber.

DETAILED DESCRIPTION OF THE PREFERRED EMBODIMENT

The apparatus and method according to the present invention involves adhesively mounting very small objects to be processed to glass stalks. Referring first to FIG. 1, there is shown drawn glass stalk 10. Glass stalk 10 has been prepared by drawing a 2-3 inch long glass tube, such as a capillary tube as is used in the medical profession to draw blood samples, in a Kopf's Needle Pipet machine, manufactured by David Kopf Instruments, of Tujunga, California. Drawing continues until a desired diameter (approximately 0.025 mm) has been achieved at the middle of the tube. After cooling, the tube is separated at the mid-point, the ends being stalks 10 as shown in FIG. 1. TiP 10b is then removed by fracturing, leaving a truncated conical glass stalk 10 as shown in FIG. 2.

For the mounting of relatively large objects, those larger than about 130 micrograms, stalk 10 can be used as it is illustrated in FIG. 2 by dipping tip 11 into RTV silicone rubber and drawing out rubber streamer 12, as shown in FIG. 3. The diameter of rubber streamer 12 must be at least 50 micrometers to insure that it is of sufficient rigidity to withstand subsequent processing. It is believed that parts up to 500 micrograms can be successfully held by streamer 12 at the expense of a fatter streamer 12 and a larger contact area with the part.

Before use, rubber streamer 12 is allowed to cure for approximately 24 hours. After this period, simply touching rubber streamer 12 to the object to be mounted will cause the object to securely adhere to rubber streamer 12. Failing to wait for this period may cause the part to be difficult to remove because of the early tenacity of the RTV silicone rubber. The object will remain secured to rubber streamer 12 through numerous processing steps, until it is removed in a conventional vacuum fixture.

For smaller objects, those smaller than about 130 micrograms, where a 50 micrometer diameter streamer is unnecessary or too large an alternate mounting procedure is illustrated in FIGS. 4 and 5. Referring first to FIG. 4, there can be seen carbon fiber 16 inserted into tip 11. The diameter of carbon fiber 16 is not critical, and can be selected for a particular case. However, a diameter of approximately 15 micrometers has been found to be adequate for most applications. Carbon fiber 16 is fixed to glass stalk 10 with conventional epoxy 14.

After epoxy 14 has dried, carbon fiber 16 is wetted with RTV silicone rubber 18, as shown in FIG. 5, and rubber 18 is allowed to cure for approximately 24 hours. After wetting and curing, the diameter of rubber 18 is approximately 25 micrometers, assuming carbon fiber 16 has a diameter of approximately 15 micrometers. Again, after curing, an object to be processed can be touched to rubber 18, and will adhere until removed in a vacuum fixture.

EXAMPLE

This mounting method was used to manufacture unique laser fusion targets. Several plastic and glass spheres, 400 $\mu$m in diameter were mounted on stalks which had 15 $\mu$m diameter carbon fibers glued in place and were coated with RTV silicone rubber as described herein. The mounting assemblies were secured in a fixture and coated in a vacuum chamber with aluminum by vapor deposition. The fixture rotated the spheres about two axes, insuring a complete $4\pi$ coating. During the coating process, none of the spheres were dislodged from the mounting stalks. After the coating was applied, a few of the spheres were removed from their stalks and examined. All were completely coated except for an area of approximately 25 square micrometers where the coated carbon fiber was in contact with the sphere. The remaining spheres, still attached to their stalks, were then placed into a dye laser micromachining station, and all of the coating of each sphere was removed except for a band, 30–50 micrometers in width, at 90° from the mounting position. After the spheres were removed from the mounting stalks, examination revealed that the spheres carried no remnants of the mounting, or any other perturbations.

The foregoing description of the present invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A fixture for mounting small parts comprising:
   a truncated conical glass stalk having a tip end and a base end; and
   a quantity of a cured adhesive attached to said tip end, and forming an extending streamer, to adhere said small parts to said streamer.

2. The fixture according to claim 1, wherein said cured adhesive comprises RTV silicone rubber.

3. The fixture according to claim 1, wherein said streamer has a nominal diameter of 50 micrometers.

4. The fixture according to claim 1, further comprising a carbon fiber extending from said tip end, wherein said streamer is formed about said carbon fiber.

5. A method of mounting small parts for processing, comprising the steps of:
   forming a truncated conical glass stalk having a tip end and a base end;
   forming on said tip end a quantity of cured adhesive having an extending streamer; and
   touching said small parts to said streamer to adhere said parts to said streamer.

6. The method as described in claim 5, wherein said adhesive comprises RTV silicone rubber.

7. The method as described in claim 5, wherein said streamer has a nominal diameter of 50 micrometers.

8. The method according to claim 5, further including the steP of gluing a carbon fiber to extend from said tip prior to forming said cured adhesive, wherein said extending streamer is formed about said fiber.

* * * * *